United States Patent
Huang et al.

(10) Patent No.: US 6,757,198 B2
(45) Date of Patent: Jun. 29, 2004

(54) METHOD FOR OPERATING A NON-VOLATILE MEMORY

(75) Inventors: Chih-Jen Huang, Hsinchu (TW); Hwi-Huang Chen, Hsinchu (TW); Gary Hong, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 10/387,712

(22) Filed: Mar. 12, 2003

(65) Prior Publication Data

US 2003/0142548 A1 Jul. 31, 2003

Related U.S. Application Data

(63) Continuation-in-part of application No. 10/047,720, filed on Jan. 14, 2002, now abandoned.

(30) Foreign Application Priority Data

Dec. 11, 2001  (TW) ........................................ 90130630 A

(51) Int. Cl.[7] .............................................. G11C 16/04
(52) U.S. Cl. ............................ 365/185.26; 365/185.18; 365/185.29
(58) Field of Search ....................... 365/185.26, 185.18, 365/185.29

(56) References Cited

U.S. PATENT DOCUMENTS

| | | | | |
|---|---|---|---|---|
| 5,894,438 A | * | 4/1999 | Yang et al. | 365/185.18 |
| 6,157,574 A | * | 12/2000 | Kalnitsky et al. | 365/185.26 |
| RE37,311 E | * | 8/2001 | Kato et al. | 365/185.26 |
| 6,525,970 B2 | * | 2/2003 | Wang et al. | 365/185.29 |

* cited by examiner

*Primary Examiner*—Huan Hoang
(74) *Attorney, Agent, or Firm*—J. C. Patents

(57) ABSTRACT

A method for operating a non-volatile memory device, which is applicable to an n-channel non-volatile memory device, wherein a positive voltage is applied to the control gate, a negative voltage is applied to the drain region while the source region is floating. Furthermore, a negative voltage is applied to the substrate to program to the n-channel memory device by the channel Fowler-Nordheim tunneling effect. To erase the n-channel non-volatile memory device, a negative voltage is applied to the control gate, a positive voltage is applied to the drain region, and the source region is floating. Moreover, a positive voltage is applied to the substrate to erase the n-channel memory device using the channel Fowler-Nordheim tunneling effect.

22 Claims, 4 Drawing Sheets

METHOD FOR OPERATING A NON-VOLATILE MEMORY

CROSS-REFERENCE TO RELATED APPLICATION

This application is a continuation-in-part of a prior application Ser. No. 10/047,720, filed Jan. 14, 2002 now abandoned. The prior application Ser. No. 10/047,720 claims the priority benefit of Taiwan application serial no. 90130630, filed on Dec. 11, 2001.

BACKGROUNDING OF THE INVENTION

1. Field of Invention

The present invention relates to a method for operating a non-volatile memory (NVM). More particularly, the present invention relates to a method for operating an n-channel non-volatile memory.

2. Description of Related Art

A stacked gate memory has the property of permanently storing information that can be repeatedly read, written or erased. Moreover, the stacked gate memory also has the advantage of retaining information even when power is interrupted. Stacked gate memory is thus a type of non-volatile memory device that is widely used in personal computer and electronic systems.

A typical stacked gate memory comprises a doped polysilicon floating gate and a doped polysilicon control gate. The programming and the erasing of this type of stacked gate memory is accomplished by applying appropriate voltages to the source/drain regions and to the control gate; thereby causing electrons to inject into and to eject from the polysilicon floating gate.

In general, the common modes for the stacked gate memory to inject electron include the channel hot-electron injection and the Fowler-Nordheim tunneling. The programming or the erasing of the device depends on an injection or an ejection of electrons.

Additionally, a stacked gate memory device can further divide into a p-channel stacked gate memory device and an n-channel stacked gate memory device. Since the n-channel stacked gate memory device has a higher carrier mobility, a higher reading current and a faster reading speed are provided. Moreover, the programming of the n-channel stacked gate memory device is normally accomplished by the channel hot-electron injection while the erasing is accomplished by ejecting electrons to the source side by the Fowler-Nordheim tunneling effect.

Referring to FIG. 1, FIG. 1 is simplified circuit diagram for a conventional n-channel stacked gate memory device array. A plurality of memory cells $Q_{m1}$ to $Q_{m4}$, a plurality of bit lines BL1, BL2 and a plurality of word lines WL1, WL2 are shown in FIG. 1. The drain regions of the memory cells $Q_{m1}$ and $Q_{m3}$ are coupled to the bit line BL1 and the drain regions of memory cells $Q_{m2}$ and $Q_{m4}$ are coupled to bit line BL2. The control gates of the memory cells $Q_{m1}$ and $Q_{m2}$ are coupled to the word line WL1, and the control gates of the memory cells $Q_{m3}$ and $Q_{m4}$ are coupled to the word line WL2. The source regions of the memory cells $Q_{m1}$ to $Q_{m4}$ share a common source line (SL).

Referring to Table 1 and FIGS. 2A to 2B, FIGS. 2A to 2B demonstrate the programming (FIG. 2A), the reading and the erasing operations (FIG. 2B) of an n-channel stacked gate memory device. Table 1 summarizes the appropriate voltages that are applied for the various operations of the memory cell $Q_{m1}$.

TABLE 1

|  | Programming | Reading | Erasure |
|---|---|---|---|
| BL1 | $+V_d$ | 1.0 V | Floating |
| BL2 | 0 V | 0 V | 0 V |
| WL1 | $+V_{cg}$ | $V_{cc}$ | $-V_{cg}$ |
| WL2 | 0 V | 0 V | 0 V |
| SL | 0 V | 0 V | $+V_s$ |
| P-well | 0 V | 0 V | 0 V |

As shown in Table 1, FIGS. 2A and 2B, 9 to 12 volts of bias $V_{cg}$ is applied to the word line WL1 (control gate 208) and 5 to 7 volts of bias $V_d$ is applied to the bit line BL1 (drain region 202) during the programming of the memory cell $Q_{m1}$. The source line SL (source region 204) and the P-well (or substrate) 200 are at 0 volt. Under such a bias condition, a large channel current (0.25~1 mamp/memory cell) is generated, and electrons then travel from the end of the source region 204 to the end of the drain region 202. Hot electrons, which have sufficient momentum to overcome the energy barrier of the tunnel oxide layer, are generated when the electrons are accelerated by the high channel electric field at the end of the drain region 202 to generate hot electrons. Additionally, a high positive bias is applied to the control gate 208 causing the hot electrons to inject into the floating gate 206 from the drain region 202 as shown in FIG. 2A. After the programming operation, the threshold voltage ($V_T$) of the memory cell increases due to the residual negative charges in the floating gate 206. These charges would remain in the floating gate 206 for a long period of time (for example, approximately for ten years at room temperature), unless they are removed intentionally.

As information is being read from the memory cell $Q_{m1}$, a bias of $V_d$ volt is applied to the bit line BL1 (drain region 202), a bias $V_{cc}$ is applied to the word line WL1 (control gate 206), a bias of 0 volt is applied to the source line SL (source region 204) and a bias of 0 volt is applied to the P-well. Since the channel of such a memory cell is closed and the current is low when electrons are present in the floating gate 206, and the channel of the memory cell is opened and the current is high when electrons are absent in the floating gate, the logic "1" or the logic "0" stored in the memory cell is determined by the opening/closing of the channel and the size of the current flow.

To erase the memory cell $Q_{m1}$, it is conventionally accomplished by the Fowler-Nordheim tunneling effect from the source side. A negative bias $-V_{cg}$ of about −8 volts to about −12 volts is applied to the word line WL1 (control gate 208), a bias $V_s$ of about 4~6 volts is applied to the source line SL (source region 204). Moreover, the bit line BL1 (drain region 202) is floating while a bias of 0 volt is applied to the P-well 200. Consequently, a great electric field is formed between the floating gate and a portion of the source region that is overlapped with the floating gate. Electrons are thus tunneled to the source region 204 from the floating gate 206 by the Fowler-Nordheim effect as shown in FIG. 2B.

The programming of the above stacked gate memory device is based on the channel hot electron, wherein electrons are injected from the drain side. The effectiveness of electron injection is thereby very low. A higher voltage is thus required to provide a higher current during programming to improve the programming speed. A higher voltage, however, reduces the reliability of electronic devices and limits the size reduction of the device.

Moreover, based on the bias setups (WL1 as $-V_{cg}$, SL as $+V_s$) shown in FIG. 1 and table 1, when $Q_{m1}$ is erased, the memory cell $Q_{m2}$ is also erased. Therefore, when a stacked gate memory device is erased according to the prior art, a sector of memory cells is erased rather than a single memory cell. Many limitations are imposed on the programming and erasing of such a device. In other words, the conventional stacked gate memory device must perform the erasing and the coding actions to complete the writing of new information. Therefore, writing of new information requires a writing of all information every time (because it needs to erase the existing information first before any coding can be done). The operational speed for the writing operation of a stacked gate memory device is thus limited.

SUMMARY OF THE INVENTION

The present invention provides a method for operating a nonvolatile memory device, where the memory device can program or erase cell-by-cell, by byte, by sector and by block.

The present invention provides a method for operating a non-volatile memory device, wherein the current flow of the memory device is lowered to increase the operating speed of the memory device.

The present invention provides a method for operating a non-volatile memory device, wherein to program the memory cell by the channel FN tunneling effect, a positive voltage is applied to the control gate, a negative voltage is applied to the drain region, the source region is floating and a negative voltage is applied to the substrate. Moreover, a negative voltage is applied to the control gate, a positive voltage is applied to the drain region, the source region is floating and a positive voltage is applied to the substrate to erase the memory cell by the channel FN tunneling effect.

According to the present invention, the channel FN tunnel effect is used for the coding and the erasing of the non-volatile memory device. A deep doped drain is also obviated from forming at the vicinity of the overlapped region between the floating gate and the source/drain region. The distance between the source region and the drain of the present invention can thus decrease without the short channel effect. In other words, the floating gate length can be reduced to increase the integration of the device without intensifying the short channel effect. Additionally, the FN tunneling effect is used for the coding operation, the effectiveness of electron injection is higher, and the current flow (about 10 nA/cell) of the memory cell during the coding operation is lower to reduce the power consumption and improve the operation speed. To program and to erase a flash cell using the FN tunneling effect, the cell current is small during operations. It implies that the power consumption of the whole chip can be significantly reduced by this invention.

The method for operating the nonvolatile memory device of the present invention, which is applicable on a memory cell array that includes a plurality of memory cells, a plurality of word lines, a plurality of bit lines and a plurality of source lines, wherein the memory cells are arranged in rows and columns. The drain region of each memory cell in every row is coupled with a corresponding bit line. The source region of each memory cell in every row is coupled with a corresponding source line. The control gate of each memory cell in each row is coupled with a corresponding word line. The method for operating the nonvolatile memory device according to an embodiment of the present invention comprises applying a first positive voltage to the word line that is coupled to a selected memory cell, a first negative voltage is applied to the bit line that is coupled to the selected memory cell, and a second negative voltage is applied to the substrate of the memory cell array. The source line that is coupled to the selected memory cell is floating and the bit lines that are coupled to all other memory cells that share a common word line with that selected memory cell are grounded. The non-selected memory cells that share a common word line with the selected memory cell are thus prevented from being programmed. When the nonvolatile memory device is erased, a third negative voltage is applied to the word line that is coupled to the selected memory cell and a second positive voltage is applied to the bit line that is coupled to the selected memory cell. A third positive voltage is also applied to the substrate of the memory cell array, and the source line that is coupled to the selected memory cell is floating, while the bit lines that are coupled to the other non-selected memory cells which share a common word line with the selected memory cell are grounded. The non-selected memory cells that share a common word line with the selected memory cell are thus prevented from being erased.

In another aspect of the present invention, the memory cells that are connected by the same bit line may also have a common well line. During the programming of the selected cell, the second negative voltage is applied to the well line that is coupled to the selected memory cell, while the well lines that are coupled to all other memory cells that share a common word line with the selected memory cell are set floating. During the erasing of the selected cell, the third positive voltage is applied to the well line that is coupled to the selected cell, while the well lines that are coupled to all other memory cells that share a common word line with the selected memory cell are floating.

The nonvolatile memory device of the present invention is programmed or erased cell-by-cell in an array of memory cells. Unlike the conventional electrically erasable and programmable read only memory (EEPROM), two transistors are required to accomplish the cell-by-cell programming and erasing. The space between the device is thereby reduced and the integration of the device is correspondingly increased. Moreover, the complexity of the process is decreased.

Additionally, the nonvolatile memory device according to the present invention can also program and erase by byte, by sector or by block simply by controlling the bias at the various word lines and bit lines.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
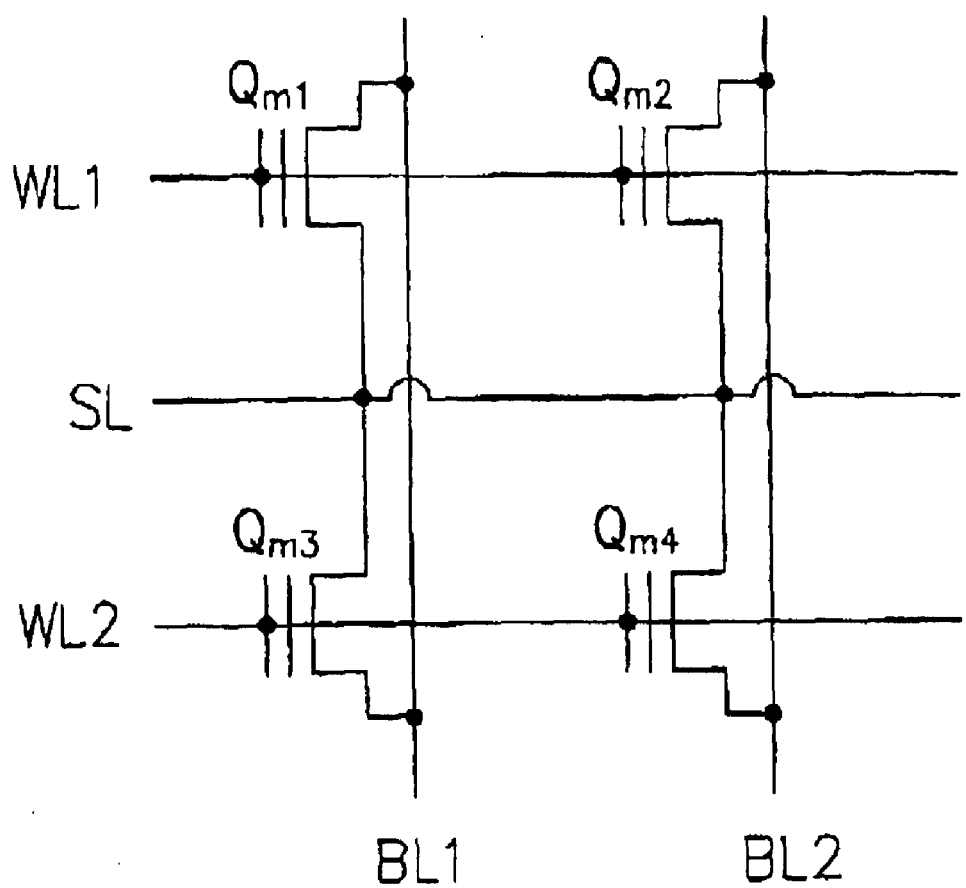
FIG. 1 is a simplified circuit diagram for an n-channel stacked gate memory device array.
Figure 2A:
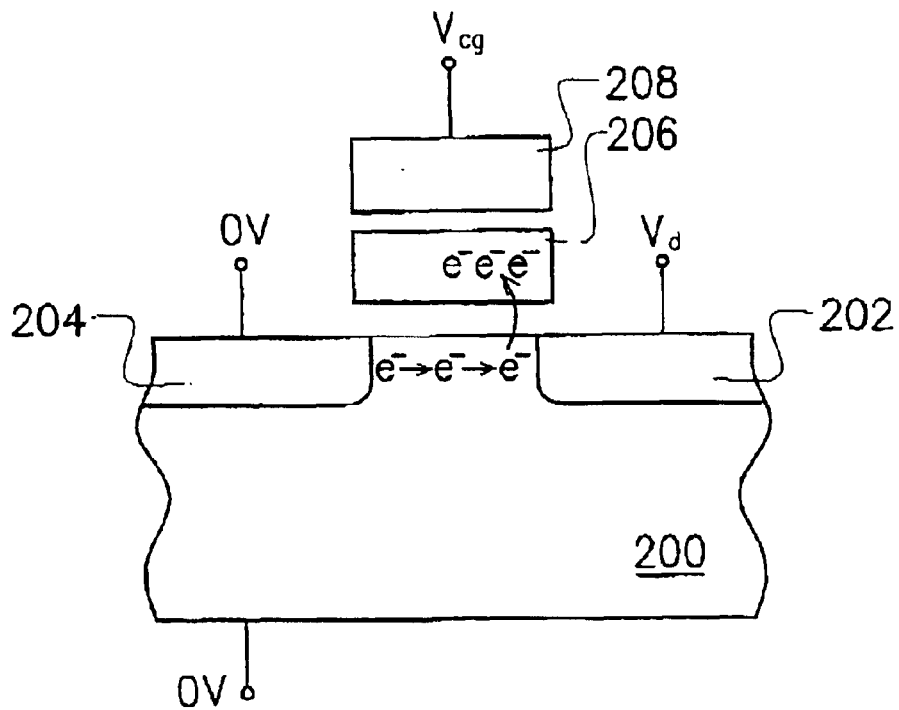
FIG. 2A illustrates the programming of a conventional n-channel stacked gate memory device.
Figure 2B:
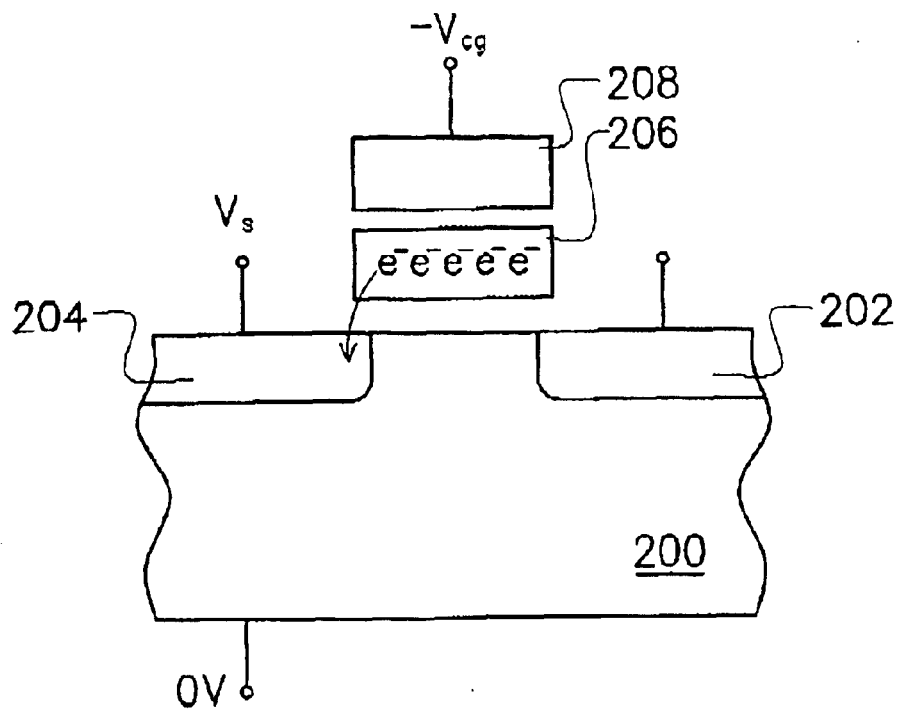
FIG. 2B illustrates the erasing of a conventional n-channel stacked gate memory device.
Figure 3:
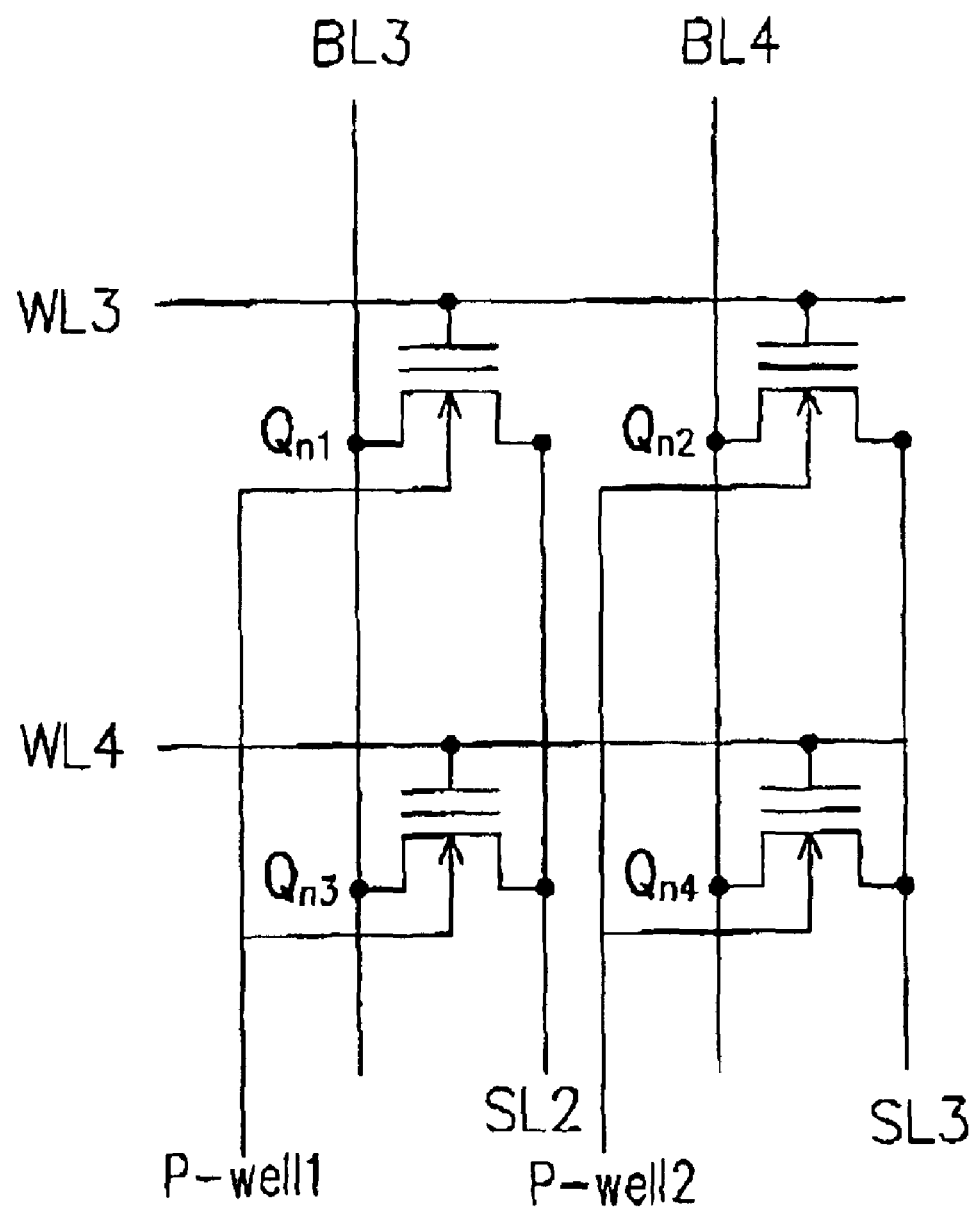
FIG. 3 is a simplified circuit diagram for an n-channel stacked gate memory device array of the present invention.

FIG. 3 is a simplified circuit diagram of an n-channel stacked gate memory device according to a preferred embodiment of the present invention.

A plurality of memory cells $Q_{n1}$ to $Q_{n4}$, a plurality of bit lines BL3 and BL4, and a plurality of word lines WL3 and WL4 are shown in FIG. 3. The drain regions of the memory cells $Q_{n1}$ and $Q_{n3}$ are coupled to the bit line BL3, whereas the drain regions of the memory cells $Q_{n2}$ and $Q_{n4}$ are coupled to the bit line BL4. The word line WL3 is connected to the control gates of the memory cells $Q_{n1}$ and $Q_{n2}$, while the control gates of the memory cells $Q_{n3}$ and $Q_{n4}$, are connected to the word line WL4. The source regions for $Q_{n1}$ and $Q_{n3}$ share a common source line SL1. The source regions of the memory cells $Q_{n2}$ and $Q_{n4}$ share a common source line SL2. Further, the memory cells $Q_{n1}$ and $Q_{n3}$ that are coupled to the same bit line BL3 also share a common well line Pwell1, while the memory cells $Q_{n2}$ and $Q_{n4}$ that are coupled to the same bit line BL4 share a common well line Pwell2.

Figure 4A:
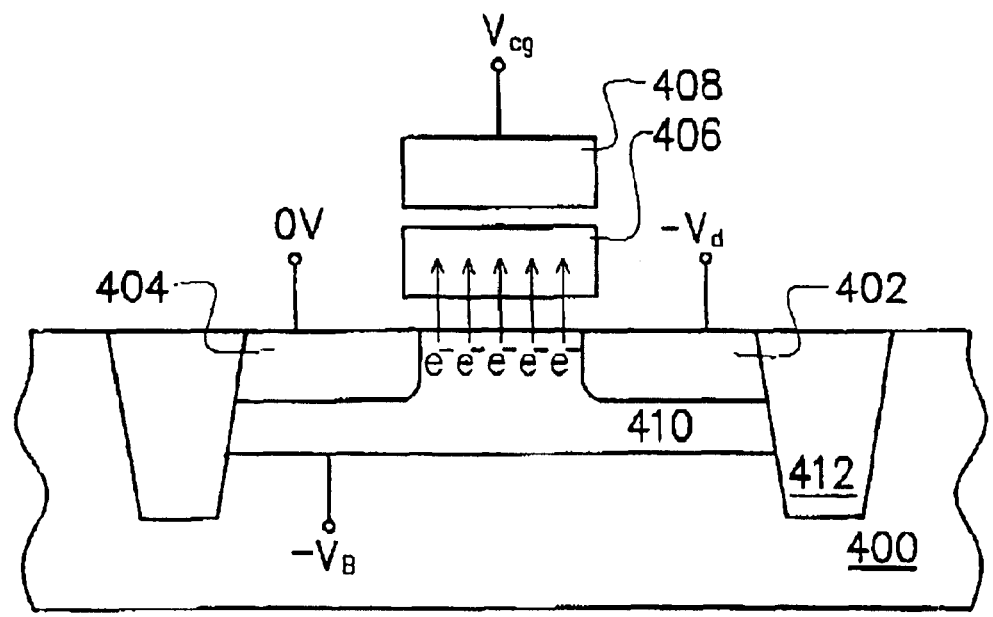
FIG. 4A illustrates the programming of an n-channel stacked gate memory device according to a preferred embodiment of the present invention.
Figure 4B:
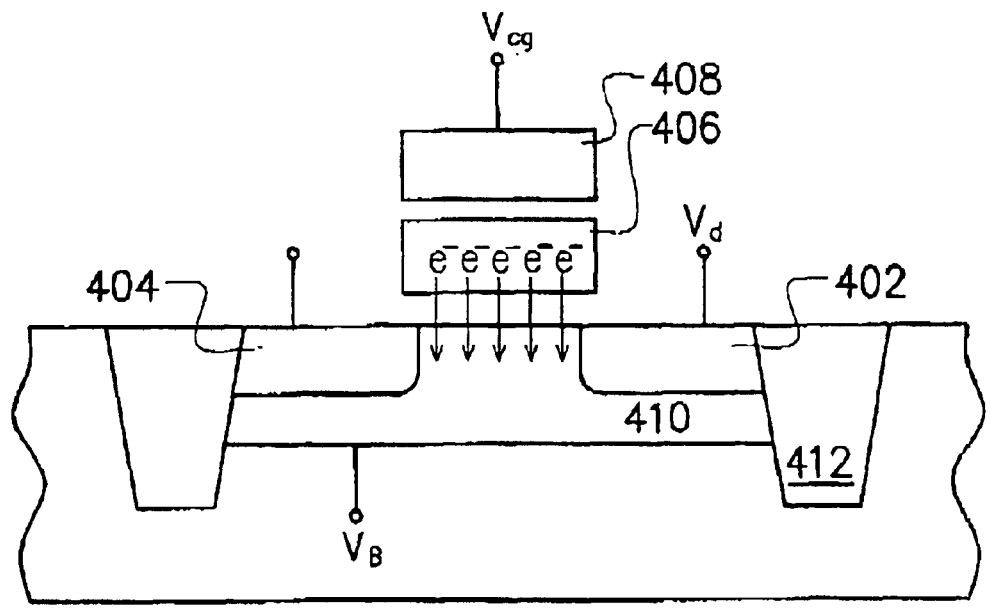
FIG. 4B illustrates the erasing of an n-channel stacked gate memory device according to a preferred embodiment of the present invention.

Table 2, FIG. 4A and FIG. 4B are used to provide an understanding of the various operations performed by an n-channel stacked gate memory device, for example, the memory cell $Q_{n1}$ in FIG. 3, according to a preferred embodiment of the present invention. These operations include programming (FIG. 4A), reading and erasing (FIG. 4B) of information.

TABLE 2

|  | Programming | Reading | Erasure |
| --- | --- | --- | --- |
| BL3 | $-V_d$ | $V_{dR}$ | $+V_d$ |
| BL4 | 0 V | 0 V | 0 V |
| WL3 | $+V_{cg}$ | $V_{cc}$ | $V_{cg}$ |
| WL4 | 0 V | 0 V | 0 V |
| SL2 | Floating | 0 V | Floating |
| SL3 | Floating | 0 V | Floating |
| P-well1 | $-V_B$ | 0 V | $+V_B$ |
| P-well2 | Floating | 0 V | Floating |

To program the memory cell $Q_{n1}$, a positive bias $V_{cg}$, for example, 10 volts to 15 volts is applied to the control gate 408, a negative bias $-V_d$, for example, -3 volts to -6 volts is applied to the drain region 402. The source region 404 is floating and a negative bias $V_B$, for example -3 volts to -6 volts, is applied to the P-well1 410 (or the substrate 400). A large electric field is thus established between the floating gate 408 and the substrate 400, inducing the electrons to inject from the channel into the floating gate 406 by the channel FN tunneling effect as illustrated in FIG. 4A. A point that is worth noting is that the depth of the well region 410 of each memory cell is shallower than that of the isolation structures 412.

When the memory cell $Q_{n1}$ is performing a reading operation, the bias at the bit line BL3 (drain region 402) is about 0.8~1.5 volt, the bias at the word line (control gate 408) is $V_{cc}$, the bias at the source line SL (source region 404) $V_s$ is 0 volt and the bias at the P-well1 is also 0 volt. Since the channel is closed and the current flow is low for a memory cell with electrons still present in the floating gate, and the channel is opened and the current flow is high for a memory cell without electrons in the floating gate, the logic "1" or the logic "0" that is stored in the memory cell can be determined by the opening or closing of the channel and by the size of the current flow.

To erase the memory cell $Q_{n1}$, a negative voltage $V_{cg}$, for example, -10 volts to -15 volts, is applied to the control gate 408. A positive voltage $V_d$, for example, 3 volts to 6 volts is also applied to the drain region 402, while the source region 404 is floating and a positive bias $V_B$, for example, 3 volts to 6 volts, is applied to the P-well1 410 (or the substrate 400). Consequently, a large electric field is established between the floating gate 406 and the P-well1 410, causing the electrons to eject from the floating gate 406 through the channel by the channel FN tunneling effect as shown in FIG. 4B.

Referring to FIG. 3, the cell-by-cell programming and erasing performed by a memory cell according to the present invention is illustrated using the memory cell $Q_{n1}$ in FIG. 3 as the example. When the memory cell $Q_{n1}$ is performing the programming operation, a positive bias $V_{cg}$, for example, 10 volts to 15 volts, is applied to WL3, while WL4 is at 0 volt. A negative bias $-V_d$, for example, -3 volts to -6 volts is also applied to the bit line BL3, while the bit line BL4 is at 0 volt (or grounded), the source line SL1 and the source line SL2 are floating. A negative bias $-V_d$, for example, -3 volts to -6 volts, is applied to the P-well1 410 (or substrate 400), while, the P-well2 is floating. Accordingly, a large electric field is established between the floating gate of the memory cell $Q_{n1}$ and the substrate, causing the electrons to inject into the floating gate through the channel by the channel FN-tunneling effect to form the write-in state.

To perform the above programming operation, the memory cell $Q_{n2}$ will not be programmed because a positive bias $V_{cg}$ is applied to WL3, 0 volt is applied to the bit line BL4 and Pwell-2 is set floating. The surface channel between the source region and the drain region of the memory cell $Q_{n2}$ is opened up to electrically connect the source region and the drain region. The channel region thereby has 0 volt. Since the channel has 0 volt, the high electric field between the floating gate and the substrate is shielded. The electric field between the floating gate and the channel is thereby not sufficient to trigger the channel FN-tunneling effect and the memory cell $Q_{n2}$ is thus program inhibit.

Moreover, the word line WL4 that connects the control gate of the memory cell $Q_{n3}$ and the control gate of the memory cell $Q_{n4}$ is at 0 volt. The channel FN tunneling effect will not be generated at the memory cells $Q_{n3}$ and $Q_{n4}$ and the memory cells $Q_{n3}$ and $Q_{n4}$ are also program inhibit.

To erase the memory cell $Q_{n1}$, a negative voltage $(-V_{cg})$, for example, -10 volts to -15 volts, is applied to WL3, while WL4 is at 0 volt and a positive bias $+V_d$, for example, 3 volt to 6 volt, is applied to the bit line BL3. Moreover, the bit line BL4 is at 0 volt (or grounded), while the source line SL1 and the source line SL2 are floating, and a positive voltage $V_B$, for example, 3 volts to 6 volts, is applied to the P-well1 410 (or substrate 400). Further, the P-well2 is set floating. Accordingly, a larger electric field is established between the floating gate of the memory cell and the substrate, causing the electrons in the floating gate to eject through the channel by the channel FN tunneling effect to form the erasing state.

To perform the aforementioned erasing operation, the information in $Q_{n2}$ will not be erased because the bit line BL4 is at 0 volt and the P-well2 line is floating. The channel FN tunneling effect of the memory cell $Q_{n2}$, which shares a common word line WL3 with the memory cell $Q_{n1}$, is thereby inhibited. The information in the memory cell $Q_{n2}$ is prevented from being erased.

Moreover, the word line WL4 that connects the memory cell $Qn_3$ and memory cell $Qn_4$ is at 0 volt, the channel FN tunneling effect will not occur at the memory cells $Q_{n3}$ and $Q_{n4}$ to prevent the information that are stored in $Q_{n3}$ and $Q_{n4}$ from being erased.

In the aforementioned preferred embodiment, the cell-by-cell erasing and programming is accomplished by a single memory cell in an array of memory cells. The method for operating an n-channel stacked gate according to the present invention, however, is also applicable for performing coding and erasing by byte, by sector and by block.

The programming and the erasing of an n-channel stacked gate memory device according to the present invention employ the channel FN tunneling effect rather than the channel hot-electron injection. Moreover, the erasing is completed by using the channel FN tunneling effect from the source side. A deep doped drain is thereby obviated from forming at the overlapped region between the source/drain region and the floating gate. The distance between the source region and the drain region according to the present invention can be decreased to prevent the short channel effect. In other words, even the floating gate length is reduced and the device integration is increased, the short channel effect is minimized. In addition, using the FN tunneling effect to perform the programming operation, electron injection is more effective. The current flow to the memory cell is lower to 10 nA/cell and the operating speed is thereby increase. To program and to erase a flash cell using the FN tunneling effect, the cell current is small during operations. It implies that the power consumption of the whole chip can be significantly reduced by this invention.

Furthermore, the n-channel stack gate memory device of the present invention can perform the cell-by-cell programming or erasing with a single memory cell. Unlike the conventional electrically erasable and programmable read only memory (EEPROM), the programming or the erasing require two transistors to complete the cell-by-cell operations. As a result, the space between devices is reduced, the integration of the device is increased and the complexity of the process is also decreased.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for operating a non-volatile memory device, wherein the non-volatile memory device comprises a control gate, a source region, a drain region and a P-well, the method comprising:

applying a first positive voltage to the control gate, a first negative voltage to the drain region, setting the source region at floating, applying a second negative voltage to the P-well to program the non-volatile memory device by a channel Fowler-Nordheim tunneling effect; and applying a third negative voltage to the control gate, a second positive voltage to the drain region, setting the source region at floating, applying a third positive voltage to the P-well to erase the non-volatile memory device by the channel Fowler-Nordheim tunneling effect without affecting status of other memory devices.

2. The method of claim 1, wherein the first positive voltage is about 10 volts to 15 volts.

3. The method of claim 1, wherein the first negative voltage is about −3 volts to about −6 volts.

4. The method of claim 1, wherein the second negative voltage is about −3 volts to about −6 volts.

5. The method of claim 1, wherein the third negative voltage is about −10 volts to about −15 volts.

6. The method of claim 1, wherein the second positive voltage is about 3 volts to about 6 volts.

7. The method of claim 1, wherein the third positive voltage is about 3 volts to about 6 volts.

8. A method for operating a non-volatile memory device, which is applicable for operating an array of memory cells, and the array of the memory cells comprises a plurality of the memory cells, a plurality of word lines, a plurality of bit lines, a plurality of source lines and a plurality of well lines, wherein the memory cells are arranged in rows and columns, a drain region of each memory cell in each column is coupled to a corresponding one of the bit lines, a source region of each memory cell in each column is coupled to a corresponding one of the source lines, a control gate of each memory cell in each row is coupled to a corresponding one of the word lines, a well region of each memory cell in each column is coupled to a corresponding one of the well lines, the method comprising:

applying a first positive voltage to one of the word lines that is coupled to a selected one of the memory cells, applying a first negative voltage to one of the bit lines that is coupled to the selected memory cell, applying a second negative voltage to the well line that is coupled to the selected memory cell, setting the source line that is coupled to the selected memory cell at floating, grounding the bit lines of a plurality of non-selected memory cells that are commonly connected to the word line of the selected memory cell, setting the well lines of the plurality of the non-selected memory cells that are commonly connected to the word line of the selected memory cell floating to program the selected memory cell and to inhibit programming of the non-selected memory cells; and applying a third negative voltage to the one of the word lines that is coupled to the selected memory cell, applying a second positive voltage to the one of the bit lines that is coupled to the selected memory cell, applying a third positive voltage to the the well line that is coupled to the selected memory cell, setting the source line that is connected to the selected memory cell floating, setting the well lines of the plurality of the non-selected memory cells that are commonly connected to the word line of the selected memory cell floating and concurrently grounding the bit lines that are coupled to the plurality of the non-selected memory cells that commonly share the word line with the selected memory cell to erase the selected memory cell and to inhibit erasing of the non-selected memory cells.

9. The method of claim 8, wherein the memory cell includes an n-channel memory device.

10. The method of claim 8, wherein the first positive voltage is about 10 volts to about 15 volts.

11. The method of claim 8, wherein the First negative voltage is about −3 volts to about −6 volts.

12. The method of claim 8, wherein the second negative voltage is about −3 volts to about −6 volts.

13. The method of claim 8, wherein the third negative voltage is about −10 volts to about −15 volts.

14. The method of claim 8, wherein the second positive voltage is about 3 volts to about 6 volts.

15. The method of claim 8, wherein the third positive voltage is about 3 volts to about 6 volts.

16. A method for operating a non-volatile memory cell in a memory device, wherein the non-volatile memory cell comprises a control gate, a source region, a drain region and a P-well, the method comprising:

applying a first positive voltage to the control gate, a first negative voltage to the drain region, setting the source region at floating, applying a second negative voltage to the P-well to program the non-volatile memory device by a channel Fowler-Nordheim tunneling effect without programming other memory cells in the memory device; and applying a third negative voltage to the control gate, a second positive voltage to the drain region, setting the source region at floating, applying a third positive voltage to the P-well to erase the non-volatile memory device by the channel Fowler-Nordheim tunneling effect without erasing other memory cells in the memory device.

17. The method of claim 16, wherein the first positive voltage is about 10 volts to 15 volts.

18. The method of claim 16, wherein the first negative voltage is about −3 volts to about −6 volts.

19. The method of claim 16, wherein the second negative voltage is about −3 volts to about −6 volts.

20. The method of claim 16, wherein the third negative voltage is about −10 volts to about −15 volts.

21. The method of claim 16, wherein the second positive voltage is about 3 volts to about 6 volts.

22. The method of claim 16, wherein the third positive voltage is about 3 volts to about 6 volts.

* * * * *